US012787722B2

(12) United States Patent
Tomczak

(10) Patent No.: US 12,787,722 B2
(45) Date of Patent: Nov. 3, 2026

(54) METHOD OF FORMING PATTERNED FEATURES

(71) Applicant: ASM IP Holding, B.V., Almere (NL)

(72) Inventor: Yoann Tomczak, Leuven (BE)

(73) Assignee: ASM IP Holding B.V., Almere (NL)

( * ) Notice: Subject to any disclaimer, the term of this patent is extended or adjusted under 35 U.S.C. 154(b) by 798 days.

(21) Appl. No.: 17/815,499

(22) Filed: Jul. 27, 2022

(65) Prior Publication Data

US 2023/0054940 A1 Feb. 23, 2023

Related U.S. Application Data

(60) Provisional application No. 63/229,332, filed on Aug. 4, 2021.

(51) Int. Cl.
*H10P 76/20* (2026.01)

(52) U.S. Cl.
CPC .................................... *H10P 76/20* (2026.01)

(58) Field of Classification Search
CPC .................................................. H01L 21/0271
See application file for complete search history.

(56) References Cited

U.S. PATENT DOCUMENTS

2008/0274413 A1* 11/2008 Millward .......... H01L 21/31144 430/5
2013/0230981 A1 9/2013 Kawamura
2017/0323782 A1* 11/2017 Suzuki ................ C23C 16/4408

FOREIGN PATENT DOCUMENTS

TW 201539540 A 10/2015

* cited by examiner

*Primary Examiner* — Joshua Benitez Rosario
*Assistant Examiner* — Christopher A Culbert
(74) *Attorney, Agent, or Firm* — Banner & Witcoff, Ltd.

(57) ABSTRACT

Methods of forming patterned features and structures including the patterned features are disclosed. Exemplary methods include selectively forming a surface energy modified surface on a sidewall of structures and/or forming a surface-energy tunable layer on a surface of the substrate. The surface energy modified surface can be formed by depositing material and/or by treating the sidewall surface and/or by treating a surface adjacent the sidewall surface.

20 Claims, 4 Drawing Sheets

METHOD OF FORMING PATTERNED FEATURES

FIELD OF INVENTION

The present disclosure generally relates to methods of forming patterned features on a surface of a substrate. More particularly, the disclosure relates to methods of forming patterned features using a surface-energy modifying or modified layer and/or a surface-energy tunable layer and to structures formed using such methods.

BACKGROUND OF THE DISCLOSURE

During the manufacture of electronic devices, fine patterns of features can be formed on a surface of a substrate by patterning the surface of the substrate and etching material from the patterned surface or selectively depositing material on the patterned surface. As a density of devices on a substrate increases, it becomes increasingly desirable to form features with smaller dimensions.

Photoresist is often used to pattern a surface of a substrate prior to etching. A pattern can be formed in the photoresist by applying a layer of photoresist to a surface of the substrate, masking the surface of the photoresist, exposing the unmasked portions of the photoresist to radiation, such as ultraviolet light, and removing a portion (e.g., the unmasked or masked portion) of the photoresist, while leaving a portion of the photoresist on the substrate surface. While traditional photoresist techniques work well for many applications, as the size of device features continue to decrease, additional patterning techniques have been developed.

Recently, directed self-assembly (DSA) techniques have been developed to reduce a pitch of patterned features on a substrate surface compared to a pitch of patterned features that can typically be obtained using traditional photoresist techniques. DSA techniques often use a layer of block copolymer material, in which the polymer domains of the block copolymer can arrange themselves on the surface. One of the domains can be removed, leaving a relatively fine pattern of features, which can be used as an etch mask or the like.

A size and orientation of the polymer domains can strongly depend on an affinity, topography, and/or nature of the substrate surface. For example, a polar or a non-polar part of the block copolymer can preferentially align on a polar or a non-polar portion of the substrate surface. To obtain desired alignment of the polymer domains, a pre-existing pattern and/or a brush layer is often used to guide the alignment of the polymer domains. Formation of a brush layer can include several lithographic and processing steps, which can be costly. Further, use of a pre-existing pattern often requires a sidewall treatment process to obtain desired orientation of the polymer domain. Such treatment can be difficult and be relatively expensive. Accordingly, improved methods of forming patterned features that allow for increased pitch and/or the use of fewer steps, while facilitating desired alignment of DSA material, are desired.

Any discussion of problems and solutions set forth in this section has been included in this disclosure solely for the purpose of providing a context for the present disclosure and should not be taken as an admission that any or all of the discussion was known at the time the invention was made.

SUMMARY OF THE DISCLOSURE

Various embodiments of the present disclosure relate to methods of forming patterned features and to structures formed using the methods. While the ways in which various embodiments of the present disclosure address drawbacks of prior methods and structures are discussed in more detail below, in general, various embodiments of the disclosure provide methods that include use of materials or layers that facilitate alignment of the directed self-assembly material using relatively few steps and/or that are relatively inexpensive. Exemplary methods include, for example, steps of selectively forming a surface-energy modifying layer on sidewalls of patterned structures and/or forming a surface-energy tunable layer on a surface of the substrate and selectively altering a surface energy of a first portion relative to a surface energy of a second portion of the surface-energy tunable layer.

In accordance with exemplary embodiments of the disclosure, a method of forming patterned features is provided. In accordance with examples of the disclosure, the method includes the steps of providing a substrate comprising patterned structures on a surface of the substrate, selectively forming a surface-energy modifying layer on sidewalls of the patterned structures, and depositing directed self-assembly material onto the substrate. The substrate can also include an underlayer. The surface-energy modifying layer facilitates orientation of one or more of first and second components of the directed self-assembly material. In accordance with exemplary aspects of these embodiments, the directed self-assembly material comprises a block copolymer comprising a first block polymer and a second block polymer. The first block polymer can correspond to the first component and the second block polymer corresponds to the second component. In accordance with further examples, the first component has a first sidewall surface energy and a first underlayer surface energy, the first sidewall surface energy being less than the first underlayer surface energy. The second component can have a second sidewall surface energy and a second underlayer surface energy, the second sidewall surface energy being greater than the second underlayer surface energy.

In accordance with additional embodiments of the disclosure, a method of forming patterned features includes providing a substrate, forming a surface-energy tunable layer on a surface of the substrate, exposing a first portion of the surface-energy tunable layer to one or more of radiation and excited species to alter a surface energy of the first portion relative to a surface energy of a second portion of the surface-energy tunable layer, and depositing directed self-assembly material, comprising first components and second components, onto the substrate. The one or more of the first portion and the second portion facilitate orientation of one or more of first and second components of the directed self-assembly material. The surface-energy tunable layer can include, for example, one or more of silicon carbide, silicon oxycarbide, and a metal oxide. Exemplary methods can additionally include a step of manipulating one or more process parameters during the step of forming the surface-energy tunable layer to modify a surface energy of the surface-energy tunable layer.

In accordance with further examples of the disclosure, a structure is provided. The structure can be formed using a method described herein. Exemplary structures include a surface-energy modifying layer on sidewalls of patterned structures and/or a surface-energy tunable layer on a surface of the substrate. The structures can additionally include directed self-assembly material.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
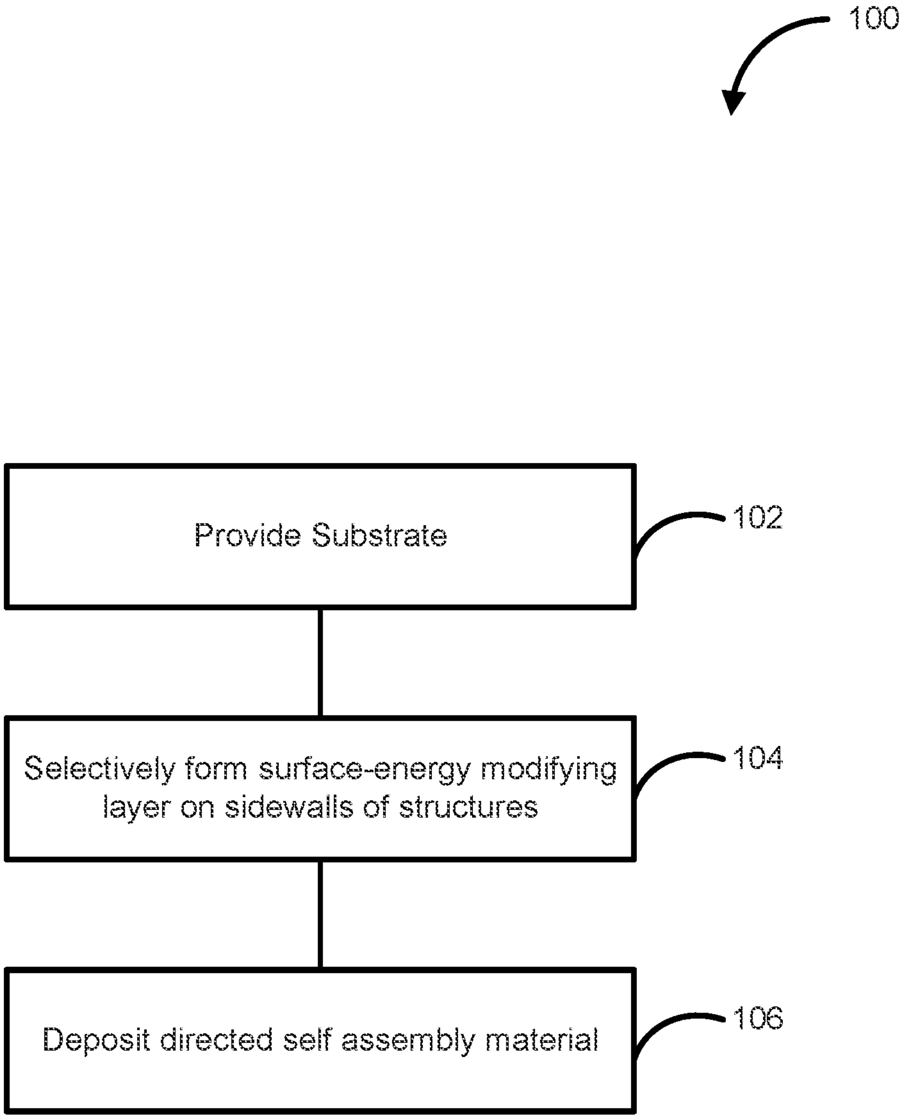
FIG. 1 illustrates a method of forming a structure in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood that the invention extends beyond the specifically disclosed embodiments and/or uses thereof and obvious modifications and equivalents thereof. Thus, it is intended that the scope of the invention disclosed should not be limited by the particular disclosed embodiments described below.

The present disclosure generally relates to methods of forming patterned features and to structures including the patterned features. As described in more detail below, exemplary methods can be used to form patterned features with relatively small dimensions, with relatively high pitch, and/or with relatively few process steps. The patterned features and structures can be used to form electronic devices, such as semiconductor devices.

As used herein, the term "substrate" may refer to any underlying material or materials including and/or upon which one or more layers can be deposited. A substrate can include a bulk material, such as silicon (e.g., single-crystal silicon), other Group IV materials, such as germanium, or compound semiconductor materials, such as GaAs, and can include one or more layers overlying or underlying the bulk material. For example, a substrate can include a patterning stack of several layers overlying bulk material. The patterning stack can vary according to application. Further, the substrate can additionally or alternatively include various structures, such as recesses, lines, protrusions, and the like formed within or on at least a portion of a layer of the substrate.

In some embodiments, "film" refers to a layer extending in a direction perpendicular to a thickness direction. In some embodiments, "layer" refers to a material having a certain thickness formed on a surface or a synonym of film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. Further, a layer or film can be continuous or discontinuous.

In this disclosure, "gas" may include material that is a gas at normal temperature and pressure, a vaporized solid and/or a vaporized liquid, and may be constituted by a single gas or a mixture of gases, depending on the context. A gas other than the process gas, i.e., a gas introduced without passing through a gas distribution assembly, such as a showerhead, other gas distribution device, or the like, may be used for, e.g., sealing the reaction space, and may include a seal gas, such as a rare gas.

In some cases, such as in the context of deposition of material, the term "precursor" can refer to a compound that participates in the chemical reaction that produces another compound, and particularly to a compound that constitutes a film matrix or a main skeleton of a film, whereas the term "reactant" can refer to a compound, in some cases other than precursors, that activates a precursor, modifies a precursor, or catalyzes a reaction of a precursor. In some cases, the terms precursor and reactant can be used interchangeably. The term "inert gas" refers to a gas that does not take part in a chemical reaction to an appreciable extent and/or a gas that excites a precursor when, for example, RF or microwave power is applied, but unlike a reactant, it may not become a part of a film matrix to an appreciable extent.

The term "cyclic deposition process" or "cyclical deposition process" may refer to the sequential introduction of precursors (and/or reactants) into a reaction chamber to deposit a layer over a substrate and includes processing techniques, such as atomic layer deposition (ALD), cyclical chemical vapor deposition (cyclical CVD), and hybrid cyclical deposition processes that include an ALD component and a cyclical CVD component.

The term "atomic layer deposition" may refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

Silicon carbide (SiC) can refer to a material that includes silicon and carbon. Silicon carbide need not necessarily be a stoichiometric composition. An amount of silicon can range from 5 to 50 at %; an amount of carbon can range from about 50 to about 95 at %. In some embodiments, SiC films may comprise one or more elements in addition to Si and C, such as H or N.

Silicon oxycarbide (SiOC) can refer to material that includes silicon, oxygen, and carbon. As used herein, unless stated otherwise, SiOC is not intended to limit, restrict, or define the bonding or chemical state, for example, the oxidation state of any of Si, O, C, and/or any other element in the film. In some embodiments, SiOC thin films may comprise one or more elements in addition to Si, O, and C, such as H or N. In some embodiments, the SiOC films may comprise Si—C bonds and/or Si—O bonds. In some embodiments, the SiOC films may comprise Si—C bonds and Si—O bonds and may not comprise Si—N bonds. In some embodiments, the SiOC films may comprise Si—H bonds in addition to Si—C and/or Si—O bonds. In some embodiments, the SiOC films may comprise more Si—O bonds than Si—C bonds, for example, a ratio of Si—O bonds to Si—C bonds may be from about 1:10 to about 10:1. In some embodiments, the SiOC films may comprise from about 0% to about 50% carbon on an atomic basis. In some embodiments, the SiOC films may comprise from about 0.1% to about 40%, from about 0.5% to about 30%, from about 1% to about 30%, or from about 5% to about 20% carbon on an atomic basis. In some embodiments, the SiOC films may comprise from about 0% to about 70% oxygen on an atomic basis. In some embodiments, the SiOC films may comprise from about 10% to about 70%, from about 15% to about 50%, or from about 20% to about 40% oxygen on an atomic basis. In some embodiments, the SiOC films may comprise about 0% to about 50% silicon on an atomic basis. In some embodiments, the SiOC films may comprise from about 10% to about 50%, from about 15% to about 40%, or from about 20% to about 35% silicon on an atomic basis. In some embodiments, the SiOC films may comprise from about 0.1% to about 40%, from about 0.5% to about 30%, from about 1% to about 30%, or from about 5% to about 20% hydrogen on an atomic basis. In some embodiments, the SiOC films may not comprise nitrogen. In some other embodiments, the SiOC films may comprise from about 0% to about 40% nitrogen on an atomic basis (at %). By way of particular examples, SiOC films can be or include a layer comprising SiOCH.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" can refer independently to "typically or broadly comprising," "comprising," "consisting essentially of," or "consisting of" in some embodiments. In accordance with aspects of the disclosure, any defined meanings of terms do not necessarily exclude ordinary and customary meanings of the terms.

Turning now to the figures, FIG. 1 illustrates a method 100 in accordance with exemplary embodiments of the disclosure. Method 100 includes the steps of providing a substrate (step 102), selectively modifying a surface energy on sidewalls of patterned structures on the substrate (step 104), and depositing directed self-assembly material onto the substrate (step 106).

Step 102 includes providing a substrate, such as a substrate described herein. The substrate can include one or more layers, including one or more material layers, to be etched. By way of examples, the substrate can include an underlayer and/or patterned structures on a surface of the substrate. The underlayer can be or include, for example, a layer comprising silicon and carbon (e.g., SiC or SiOC). In some cases, the underlayer can be or include one or more of a metal oxide, a metal nitride, and a metal oxynitride. In some cases, the photoresist underlayer can additionally include carbon. The carbon can be incorporated into the photoresist underlayer as the photoresist underlayer is deposited and/or a carbon treatment can be applied to a surface of the photoresist underlayer. Additionally or alternatively, a carbon-containing layer or other layer can be deposited onto a surface of the photoresist underlayer. A thickness of the underlayer can be about 0.2 to about 10 nm. The structures can be formed of, for example, photoresist, extreme ultraviolet (EUV) resists, a polymer assembly (e.g., containing one or several monomers or block-copolymers) and/or Si or metal centers, or the like. In some cases, components of directed self-assembly material can serve as structures for subsequent patterning steps.

Step 104 includes selectively modifying a surface-energy on sidewalls 307 relative to a surface energy of a surface 314 (e.g., on top of structures 304 and/or 305) and/or a surface 316 between the structures or at the bottom of a structure. Step 104 can include depositing a surface-energy modifying layer and/or treating a surface (e.g., surface 314, 316, and/or 307). A surface-energy modified (or modifying) layer can be or include, for example, one or more of silicon carbide, silicon oxycarbide (SiOC), silicon oxynitride, amorphous carbon—any or all of which could be doped with elements, such as B, F, or the like. The step of selectively modifying can include selective deposition, selective etching techniques, and/or selective treatment steps. For example, a direct plasma in which the plasma gas is formed using a nitrogen-containing gas, such as nitrogen, can result in selective dangling bond formation on the bottom and top surface vis-à-vis the sidewall. Additionally or alternatively, selective deposition can be achieved via directional (e.g., direct) plasmas during deposition or etch steps.

In some cases, forming a surface-energy modifying layer 306 on sidewalls 307 of the patterned structures 304, 305 can include creating a difference in surface energy between sidewalls 307 on the one hand and a top surface 314 of structures 304, 305 and/or surface 316 of substrate 302 on the other hand that is between structures 304, 305. This can be done using a deposition, a post-deposition plasma treatment, etch, or any combination. Thus, in some cases, a difference in surface energy between sidewalls on the one hand and top and/or bottom surface adjacent the sidewalls on the other hand can be created during deposition and/or during a post-deposition treatment step. This can be done by changing the surface energy of the top and/or bottom surfaces, by changing the surface energy of the sidewalls, or by changing both in different ways. For example, a layer of doped or undoped silicon carbide, silicon oxycarbide (SiOC), silicon oxynitride, and/or amorphous carbon can be deposited and either the deposition process parameters and/or post-deposition treatments can be used to obtain desired sidewall surface energy relative to the surface energy of surface 314 and/or 316.

An exemplary process for depositing an SiOC layer is suitable for use in step 104 is described below in connection with step 204. Exemplary treatment processes are also described below. When step 104 includes a layer deposition, a layer thickness can be between about 0.3 and about 5 nm.

By way of example, step 104 can include a selective PECVD of amorphous carbon followed by, for example, an Ar/$H_2$ plasma post treatment, a PEALD of SiON with or without a halogen gas (e.g., $CX_4$, where X is F, Cl, Br, I, or combinations thereof (e.g., $CF_4$)) plasma post-treatment, or other treatment noted herein. In accordance with other examples, the post-treatment can include exposing a surface to excited species formed by exposing a phosphorus-containing gas, e.g. $PH_3$, to a plasma. In accordance with examples of the disclosure, an additional treatment is not performed on the surface-energy modifying layer on sidewalls of the patterned structures.

During step 106, directed self-assembly material is deposited onto the substrate. The directed self-assembly material can be deposited on a substrate surface using any suitable means, such as spin-on coating techniques or gas-phase techniques, such as CVD, ALD, PECVD, PEALD, or the like. The directed self-assembly material can include first components and second components, the alignment of which can be facilitated by the surface-energy modifying layer formed during step 104.

By way of examples, the directed self-assembly material can be or include polymeric material, such as a block copolymer including a first block polymer and a second block polymer. Exemplary suitable block copolymers include polystyrene-block-poly(methyl methacrylate) (PS-b-PMMA), polystyrene-b-polyisoprene-b-polystyrene (PS-b-PI-b-PS). Other suitable block copolymers include polystyrene and/or emerging "high-Chi" polymers. In the case of block copolymers, the polymers or blocks can phase separate and form aligned structures (e.g., first and second components that, e.g., correspond to the first block polymer and the second block polymer).

In accordance with examples of the disclosure, the first component has a first sidewall surface energy and a first underlayer (or substrate) surface energy, the first sidewall surface energy being less than the first underlayer (or substrate) surface energy. Additionally or alternatively, the second component has a second sidewall surface energy and a second underlayer (or substrate) surface energy, the second sidewall surface energy being greater than the second underlayer (or substrate) surface energy. As used herein, the term surface energy can refer to a dispersive and/or a polar component of the surface energy. Further, as used in this paragraph, sidewall and surface can be modified as described above. These differences in surface energy facilitate alignment of the first and/or second components of the directed self-assembly material, relative to the surface-energy modifying layer on sidewalls of the patterned structures.

Figure 3:
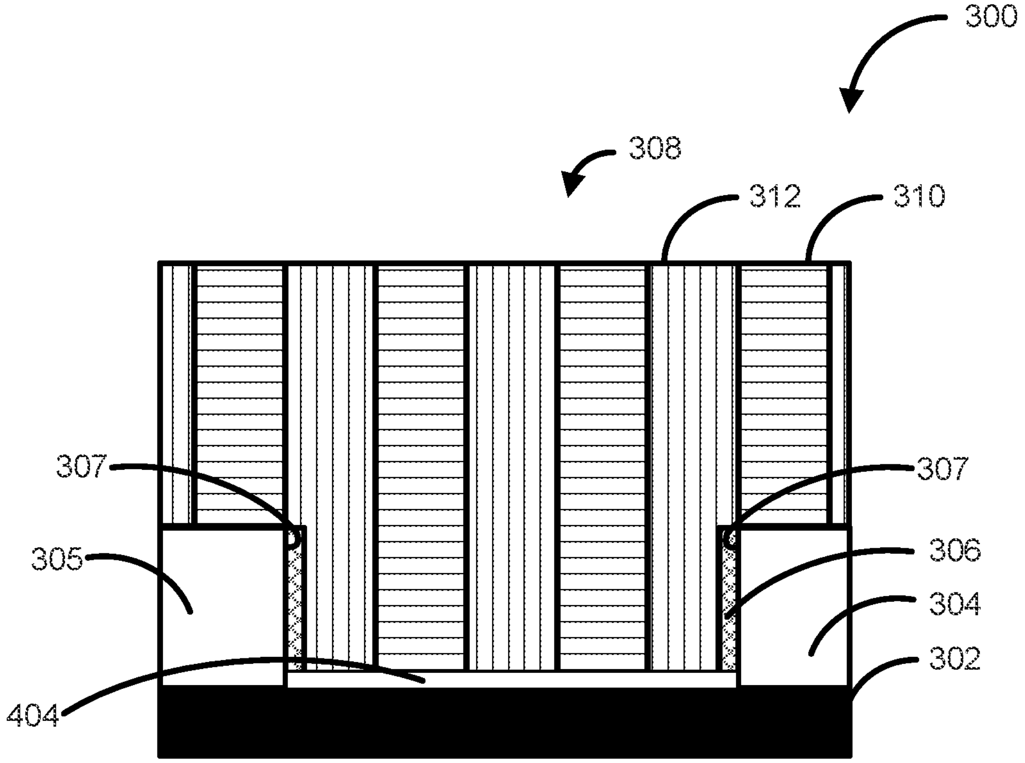
FIG. 3 illustrates a structure in accordance with exemplary embodiments of the disclosure.

FIG. 3 illustrates a structure 300 formed according to method 100. Structure 300 includes a substrate 302, structures 304, 305 formed on a surface of substrate 302, a selectively formed surface-energy modified layer 306 on (or part of) sidewall(s) 307, and directed self-assembly material 308, including first components 310 and second components 312. In some cases, structures 304, 305 may be a single structure (e.g., a sidewall of a recess or via). As illustrated, first components 310 and second components 312 are aligned relative to surface-energy modified layer 306. In the illustrated example, surface-energy modified layer 306 can facilitate alignment of second components 312, and alignment of first components 310 can be directed by second components 312. Alternatively, surface-energy modifying layer 306 can facilitate alignment of first components 310, and alignment of second components 312 can be directed by first components 310.

Figure 2:
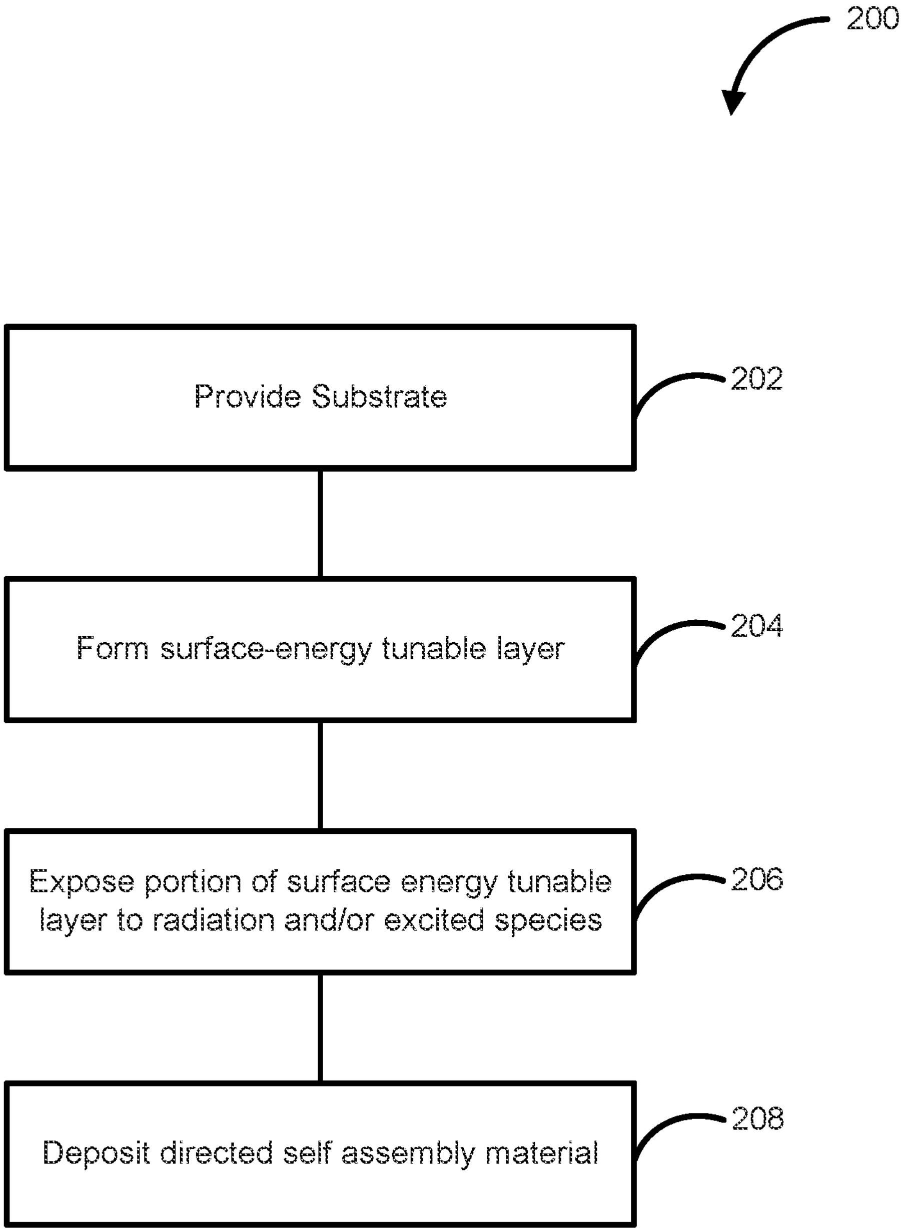
FIG. 2 illustrates another method of forming a structure in accordance with exemplary embodiments of the disclosure.
Figure 4:
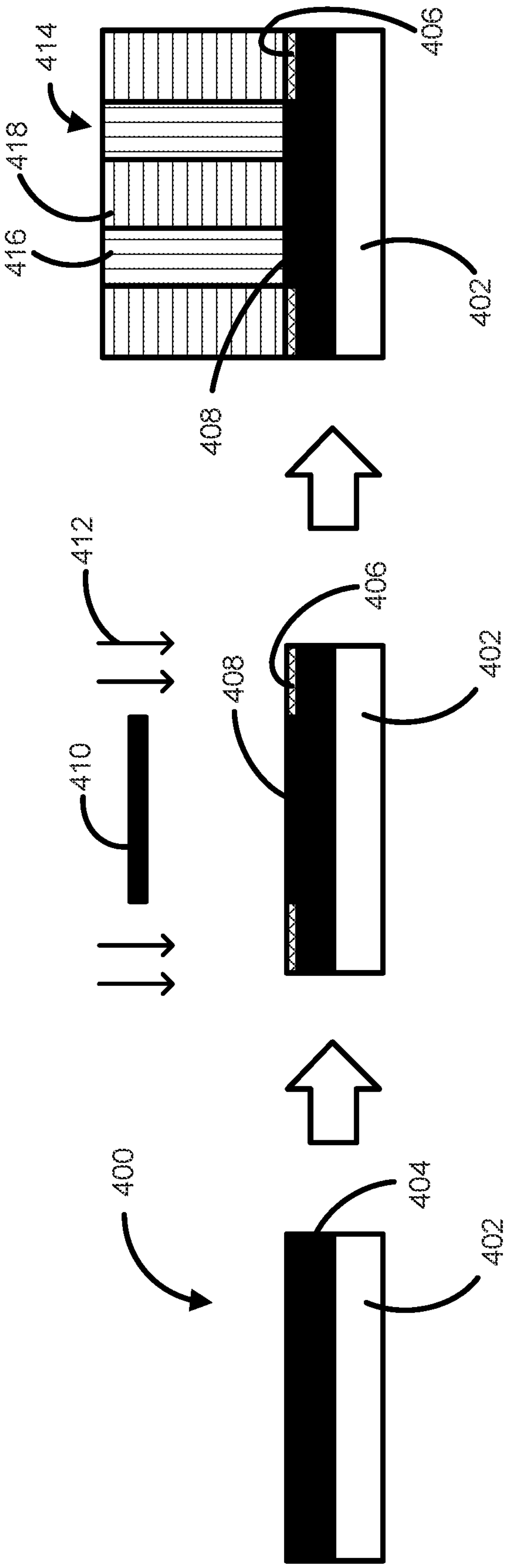
FIG. 4 illustrates structures in accordance with exemplary embodiments of the disclosure.

FIG. 2 illustrates another method 200 of forming patterned features in accordance with additional embodiments of the disclosure. FIG. 4 illustrates structures formed during steps of method 200.

Method 200 includes the steps of providing a substrate (202), forming a surface-energy tunable layer on a surface of the substrate (204), exposing a first portion of the surface-energy tunable layer to one or more of radiation and excited species (206), and depositing directed self-assembly material onto the substrate (208).

Step 202 includes providing a substrate (e.g., substrate 402), such as a substrate described herein. The substrate can include one or more layers, including one or more material layers, to be etched.

During step 204, a surface-energy tunable layer 404 is formed on a surface of the substrate. Surface-energy tunable layer 404 can be formed using a cyclical deposition process, such as ALD (e.g., plasma-enhanced ALD (PEALD)). By depositing surface-energy tunable layer 404 using PEALD, one can manipulate process parameters (e.g., plasma power, plasma type, precursor type, post treatment) during the step of forming the surface-energy tunable layer to control the surface energy of the resulting layer and match an affinity of (or facilitate alignment of) components of directed self-assembly material. The surface energy of surface-energy tunable layer 404 can then be adapted to match a different surface-energy tunable layer 404 (e.g., polymer blends). With other techniques, an underlayer might require a different "brush" layer for each block copolymer blend. Such brush layers are not necessary for use with methods described herein. Rather, manipulation of process conditions during deposition of surface-energy tunable layer 404 can facilitate alignment of a component of various directed self-assembly materials.

Surface-energy tunable layer 404 can be or include, for example, a metal oxide, where the metal is selected from the group consisting of one or more of titanium, tin, hafnium, zirconium, indium, antimony, tellurium, iodine, and cesium; SiC; or SiOC. The metal oxide, SiC, and/or the SiOC can additionally include nitrogen.

By way of examples, surface-energy tunable layer 404 can include SiOC formed using a PEALD process that includes providing a precursor selected from the group consisting of silane derivatives, disilane derivatives or trisilane derivatives and compounds represented by the following formulas (i), (ii), and (iii) and a reactant to a reaction chamber.

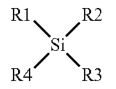

(i)

where R1-R4 are independently selected, where at least one of R1-R4 comprises a C1-C4 alkoxy or C1-C4 alkylamide group, and where the other of R1-R4 comprise one or more of C1-C4 alkyl group, a C1-C4 alkoxy group or a C1-C4 alkylamide group. By way of examples, compounds represented by formula (i) can include two alkoxy (e.g., methoxy) groups and two alkyl (e.g., methyl) groups.

(ii)

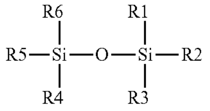

where R1-R6 are independently selected, where at least one of R1-R6 comprises a C1-C4 alkoxy or C1-C4 alkylamide group, and where the other of R1-R6 comprise one or more of C1-C4 alkyl group, a C1-C4 alkoxy group or a C1-C4 alkylamide group. By way of examples, compounds represented by formula (ii) can include two alkoxy (e.g., methoxy) groups and four alkyl (e.g., methyl) groups.

(iii)

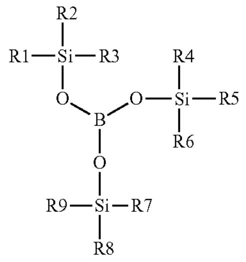

where R1-R9 are independently selected, and where each of R1-R9 comprise one or more of C1-C4 alkyl group. By way of examples, R1-R9 can each be a methyl group. In accordance with additional examples, boron can be replaced by phosphorus in formula (iii).

Additional exemplary precursors can include compounds having similar formulas with one to three silicon atoms, oxygen, and any combination of functional groups noted above in connection with formulas (i)-(iii).

The reactant selected from the group consisting of Ar, $H_2$, $O_2$, $N_2$, $NH_3$, He, or a halogen, such as a reactant comprising F, Cl, Br, and/or I. Exemplary halogen reactants include $NX_3$, $CX_4$, $CHX_3$, $CH_2X_2$, $CX_4$, wherein X is one or more of F, Cl, Br, and I (e.g., $NF_3$, $CF_4$, $CHF_3$, $CH_2F_2$, $CBr_4$) or a combination of these. A PEALD process can include exposing at least one of the precursor and the reactant to a plasma (direct or remote) to form active species and thereby form surface-energy tunable layer 404. A (e.g., RF) plasma power can be between about 30 and about 1000 W, e.g. between about 50 and about 200 W. A thickness of surface-energy tunable layer 404 can range from about 0.3 to about 20 nm, or from about 0.3 to about 5 nm.

During step 206, a first portion 406 of the surface-energy tunable layer is exposed to one or more of radiation and excited species 412 to alter a surface energy of first portion 406 relative to a surface energy of a second portion 408 of surface-energy tunable layer 404. By way of examples, the radiation can be in the form of EUV radiation. The excited species can include ions and/or radicals, which can be formed using a direct or remote plasma apparatus. The excited species can be blocked or masked from second portion 408 using a mask 410.

In some cases, method 200 can include a step of treating the surface-energy tunable layer prior to the step of exposing. The step of treating can include, for example, $Ar/H_2$ plasma, $O_2/Ar$ plasma, $He/H_2$ plasma, or a halogen plasma, such as a plasma formed using a gas including one or more of F, Cl, Br, and I (e.g., $NX_3$ plasma or $CX_4$ plasma, wherein X is F, Cl, Br, I or any combination thereof) or the like. A (e.g., RF) plasma power can be about 30 to about 1000 W, or from about 50 to about 200 W. A duration of the plasma power can be about 0.1 s to about 60 seconds.

During step 208, directed self-assembly material 414 is deposited onto surface-energy tunable layer 404. Step 208 can be the same or similar to step 106 described above, and directed self-assembly material 414 can be as described above. For example, directed self-assembly material 414 can include first components 416 and second components 418, the alignment or orientation of which can be facilitated by one or more of first portion 406 and/or second portions 408.

To further facilitate alignment of components 416, 418 of directed self-assembly material, methods can include both (1) forming a surface-energy tunable layer on a surface of the substrate and exposing a first portion of the surface-energy tunable layer to one or more of radiation and excited species to alter a surface energy of the first portion relative to a surface energy of a second portion of the surface-energy tunable layer, as described in connection with FIGS. 2 and 4, and (2) selectively forming a surface-energy modifying layer on sidewalls of the patterned structures as described above in connection with FIGS. 1 and 3. For example, structure 300 can include structures 304, 305 formed on a surface of substrate 302, selectively formed surface-energy modifying layer 306 on sidewall(s) 307 of the structures, and a surface-energy tunable layer 404, which can have a surface modified as described herein. Alternatively, a structure can include patterned structures 304, 305 and surface-energy tunable layer 404, without surface-energy modifying layer 306.

Methods described herein can be used to form structures including directed self-assembly material with aligned components. The components can be aligned in plane with the selectively formed surface-energy modifying layer 306 or structures or a surface-energy tunable layer or be aligned perpendicular thereto. Such methods can obtain the aligned components, without use of a brushing layer. Moreover, the tunability of the surface energy of the surface-energy tunable layer can help adapt the underlayer (the surface-energy tunable layer) properties according to the nature/composition of the directed self-assembly material (which can vary depending on structure critical dimension (CD) desired).

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

The invention claimed is:

1. A method of forming patterned features, the method comprising the steps of:

providing a substrate comprising an underlayer and patterned structures on a surface of the substrate;

selectively forming a surface-energy modified layer on sidewalls of the patterned structures; and depositing directed self-assembly material onto the substrate, wherein the surface-energy modified layer facilitates orientation of one or more of first and second components of the directed self-assembly material.

2. The method of claim 1, wherein the directed self-assembly material comprises a block copolymer comprising a first block polymer and a second block polymer.

3. The method of claim 2, wherein the first block polymer corresponds to the first component and the second block polymer corresponds to the second component.

4. The method of claim 1, wherein the first component has a first sidewall surface energy and a first underlayer surface energy, the first sidewall surface energy being less than the first underlayer surface energy.

5. The method of claim 4, wherein the second component has a second sidewall surface energy and a second underlayer surface energy, the second sidewall surface energy being greater than the second underlayer surface energy.

6. The method of claim 1, wherein the underlayer comprises silicon and carbon.

7. The method of claim 1, wherein the surface-energy modified layer comprises one or more of silicon carbide, silicon oxycarbide, silicon oxynitride, and amorphous carbon.

8. The method of claim 1, wherein the step of selectively forming the surface-energy modified layer on the sidewalls of the patterned structures comprises selective deposition of the surface-energy modified layer.

9. The method of claim 8, wherein the step of selectively forming the surface-energy modified layer comprises a cyclical deposition process.

10. The method of claim 8, wherein the step of selectively forming the surface-energy modified layer comprises an atomic layer deposition process.

11. The method of claim 8, wherein the selective deposition of the surface-energy modified layer comprises using directional plasmas.

12. The method of claim 9, wherein the cyclical deposition process is a plasma-enhanced cyclical deposition method.

13. The method of claim 1, wherein the underlayer comprises a surface-energy tunable layer.

14. The method of claim 13, further comprising manipulating one or more process parameters to modify a surface energy of the underlayer.

15. The method of claim 14, wherein the step of manipulating facilitates alignment of a component of the directed self-assembly material.

16. The method of claim 4, wherein a polar component of the first sidewall surface energy is less than a polar component of the first underlayer surface energy.

17. The method of claim 4, wherein a dispersive component of the first sidewall surface energy is less than a dispersive component of the first underlayer surface energy.

18. The method of claim 5, wherein a polar component of the second sidewall surface energy is greater than a polar component of the second underlayer surface energy.

19. The method of claim 5, wherein a dispersive component of the second sidewall surface energy is greater than a dispersive component of the second underlayer surface energy.

20. The method of claim 7, wherein each of the silicon carbide, the silicon oxycarbide, the silicon oxynitride, and the amorphous carbon is doped with Boron or Fluorine.

* * * * *